United States Patent
Hsiao et al.

(10) Patent No.: US 12,334,476 B2
(45) Date of Patent: Jun. 17, 2025

(54) SEMICONDUCTOR DEVICE WITH DISCRETE BLOCKS

(71) Applicant: Taiwan Semiconductor Manufacturing Co., Ltd., Hsinchu (TW)

(72) Inventors: Ching-Wen Hsiao, Hsinchu (TW); Chen-Shien Chen, Zhubei (TW); Wei Sen Chang, Jinsha Township (TW); Shou-Cheng Hu, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 18/525,273

(22) Filed: Nov. 30, 2023

(65) Prior Publication Data
US 2024/0113080 A1    Apr. 4, 2024

Related U.S. Application Data

(60) Continuation of application No. 17/567,435, filed on Jan. 3, 2022, now Pat. No. 11,855,045, which is a
(Continued)

(51) Int. Cl.
*H01L 29/00* (2006.01)
*H01L 21/48* (2006.01)
(Continued)

(52) U.S. Cl.
CPC ...... *H01L 25/0657* (2013.01); *H01L 21/4853* (2013.01); *H01L 21/4857* (2013.01);
(Continued)

(58) Field of Classification Search
CPC .............. H01L 23/486; H01L 23/64; H01L 2924/19011; H01L 2924/19041–19042; H01L 2924/19105
(Continued)

(56) References Cited

U.S. PATENT DOCUMENTS 5,600,541 A    2/1997  Bone et al.
5,969,426 A *  10/1999 Baba ..................... H01L 21/568
                                                     257/676

(Continued)

FOREIGN PATENT DOCUMENTS

CN    101315924 A    12/2008
CN    102034718 A    4/2011
(Continued)

OTHER PUBLICATIONS

Cheah, Bok Eng, et al., "A Novel Inter-Package Connection for Advanced Package-on-Package Enabling," IEEE Electronic Components and Technology Conference, May 31, 2011-Jun. 3, 2011, pp. 589-594.
(Continued)

*Primary Examiner* — Nitin Parekh
(74) *Attorney, Agent, or Firm* — Slater Matsil, LLP

(57) ABSTRACT

A semiconductor device and a method of manufacture are provided. In particular, a semiconductor device using blocks, e.g., discrete connection blocks, having through vias and/or integrated passive devices formed therein are provided. Embodiments such as those disclosed herein may be utilized in PoP applications. In an embodiment, the semiconductor device includes a die and a connection block encased in a molding compound. Interconnection layers may be formed on surfaces of the die, the connection block and the molding compound. One or more dies and/or packages may be attached to the interconnection layers.

20 Claims, 17 Drawing Sheets

Related U.S. Application Data continuation of application No. 16/715,488, filed on Dec. 16, 2019, now Pat. No. 11,217,562, which is a continuation of application No. 16/017,060, filed on Jun. 25, 2018, now Pat. No. 10,510,727, which is a continuation of application No. 15/401,851, filed on Jan. 9, 2017, now Pat. No. 10,008,479, which is a division of application No. 14/886,775, filed on Oct. 19, 2015, now Pat. No. 9,543,278, which is a division of application No. 13/608,946, filed on Sep. 10, 2012, now Pat. No. 9,165,887.

(51) Int. Cl.

| | |
|---|---|
| H01L 21/56 | (2006.01) |
| H01L 21/683 | (2006.01) |
| H01L 23/00 | (2006.01) |
| H01L 23/31 | (2006.01) |
| H01L 23/48 | (2006.01) |
| H01L 23/522 | (2006.01) |
| H01L 23/528 | (2006.01) |
| H01L 23/538 | (2006.01) |
| H01L 23/64 | (2006.01) |
| H01L 25/065 | (2023.01) |
| H01L 23/50 | (2006.01) |

(52) U.S. Cl.
CPC ............ *H01L 21/486* (2013.01); *H01L 21/56* (2013.01); *H01L 21/6835* (2013.01); *H01L 21/6836* (2013.01); *H01L 23/3128* (2013.01); *H01L 23/3142* (2013.01); *H01L 23/481* (2013.01); *H01L 23/5222* (2013.01); *H01L 23/528* (2013.01); *H01L 23/538* (2013.01); *H01L 23/5389* (2013.01); *H01L 23/64* (2013.01); *H01L 24/19* (2013.01); *H01L 24/24* (2013.01); *H01L 23/50* (2013.01); *H01L 2221/68327* (2013.01); *H01L 2221/68359* (2013.01); *H01L 2224/0231* (2013.01); *H01L 2224/02372* (2013.01); *H01L 2224/02373* (2013.01); *H01L 2224/0401* (2013.01); *H01L 2224/04105* (2013.01); *H01L 2224/05124* (2013.01); *H01L 2224/05147* (2013.01); *H01L 2224/05184* (2013.01); *H01L 2224/11002* (2013.01); *H01L 2224/12105* (2013.01); *H01L 2224/13023* (2013.01); *H01L 2224/13024* (2013.01); *H01L 2224/16225* (2013.01); *H01L 2224/16227* (2013.01); *H01L 2224/24195* (2013.01); *H01L 2224/2518* (2013.01); *H01L 2224/73267* (2013.01); *H01L 2225/06517* (2013.01); *H01L 2225/06541* (2013.01); *H01L 2225/06548* (2013.01); *H01L 2225/06572* (2013.01); *H01L 2225/1035* (2013.01); *H01L 2225/1041* (2013.01); *H01L 2225/1058* (2013.01); *H01L 2924/1434* (2013.01); *H01L 2924/15311* (2013.01); *H01L 2924/181* (2013.01); *H01L 2924/19011* (2013.01); *H01L 2924/19041* (2013.01); *H01L 2924/19043* (2013.01); *H01L 2924/19105* (2013.01)

(58) Field of Classification Search
USPC .................................................. 257/532, 724
See application file for complete search history.

(56) References Cited

U.S. PATENT DOCUMENTS

| | | | |
|---|---|---|---|
| 5,977,640 A | | 11/1999 | Bertin et al. |
| 6,087,719 A | * | 7/2000 | Tsunashima ............ H01L 25/50 |
| | | | 356/6 |
| 6,153,290 A | | 11/2000 | Sunhara |
| 6,281,046 B1 | | 8/2001 | Lam |
| 6,335,565 B1 | | 1/2002 | Miyamoto et al. |
| 7,105,920 B2 | | 9/2006 | Su et al. |
| 7,545,047 B2 | | 6/2009 | Bauer et al. |
| 7,573,136 B2 | | 8/2009 | Jiang et al. |
| 7,619,901 B2 | | 11/2009 | Eichelberger et al. |
| 7,795,721 B2 | | 9/2010 | Kurita |
| 7,838,337 B2 | | 11/2010 | Marimuthu et al. |
| 7,969,009 B2 | | 6/2011 | Chandrasekaran |
| 8,093,704 B2 | * | 1/2012 | Palmer .................. H01L 25/105 |
| | | | 257/E23.116 |
| 8,093,722 B2 | | 1/2012 | Chen et al. |
| 8,097,490 B1 | | 1/2012 | Pagaila et al. |
| 8,105,875 B1 | | 1/2012 | Hu et al. |
| 8,138,014 B2 | | 3/2012 | Chi et al. |
| 8,143,097 B2 | | 3/2012 | Chi et al. |
| 8,213,185 B2 | * | 7/2012 | Minegishi ......... H01L 23/49827 |
| | | | 361/783 |
| 8,263,439 B2 | | 9/2012 | Marimuthu et al. |
| 8,293,580 B2 | | 10/2012 | Kim et al. |
| 8,361,842 B2 | | 1/2013 | Yu et al. |
| 8,435,835 B2 | | 5/2013 | Pagaila et al. |
| 8,476,769 B2 | | 7/2013 | Chen et al. |
| 8,482,118 B2 | | 7/2013 | Mohan et al. |
| 8,503,186 B2 | | 8/2013 | Lin et al. |
| 8,508,045 B2 | | 8/2013 | Khan et al. |
| 8,604,568 B2 | | 12/2013 | Stacey |
| 8,604,615 B2 | | 12/2013 | Lee et al. |
| 8,692,368 B2 | * | 4/2014 | Pan ....................... H02M 3/003 |
| | | | 438/106 |
| 8,710,657 B2 | | 4/2014 | Park et al. |
| 8,736,035 B2 | | 5/2014 | Hwang et al. |
| 8,754,514 B2 | | 6/2014 | Yu et al. |
| 8,791,016 B2 | | 7/2014 | Gambino et al. |
| 8,841,748 B2 | | 9/2014 | Joblot et al. |
| 8,872,319 B2 | | 10/2014 | Kim et al. |
| 8,928,114 B2 | | 1/2015 | Chen et al. |
| 8,941,235 B2 | | 1/2015 | Pendse |
| 8,957,525 B2 | | 2/2015 | Lyne et al. |
| 8,975,726 B2 | | 3/2015 | Chen et al. |
| 9,048,306 B2 | | 6/2015 | Chi et al. |
| 9,087,832 B2 | | 7/2015 | Huang et al. |
| 9,087,835 B2 | | 7/2015 | Sutardja et al. |
| 9,373,527 B2 | | 6/2016 | Yu et al. |
| 9,385,006 B2 | | 7/2016 | Lin et al. |
| 9,455,313 B1 | | 9/2016 | Christensen et al. |
| 9,768,048 B2 | | 9/2017 | Lin et al. |
| 11,887,930 B2 | | 1/2024 | Lee et al. |
| 2002/0117743 A1 | | 8/2002 | Nakatani et al. |
| 2003/0001240 A1 | | 1/2003 | Whitehair et al. |
| 2003/0116856 A1 | | 6/2003 | Tomsio et al. |
| 2003/0219969 A1 | | 11/2003 | Saito et al. |
| 2004/0095734 A1 | | 5/2004 | Nair |
| 2004/0187297 A1 | | 9/2004 | Su et al. |
| 2004/0256731 A1 | | 12/2004 | Mao et al. |
| 2006/0043549 A1 | | 3/2006 | Hsu |
| 2006/0063312 A1 | | 3/2006 | Kurita |
| 2006/0133056 A1 | | 6/2006 | Wyrzykowska et al. |
| 2007/0161266 A1 | | 7/2007 | Nishizawa |
| 2007/0164457 A1 | | 7/2007 | Yamaguchi |
| 2007/0181974 A1 | | 8/2007 | Coolbaugh et al. |
| 2008/0006936 A1 | | 1/2008 | Hsu |
| 2008/0142976 A1 | | 6/2008 | Kawano |
| 2008/0220563 A1 | | 9/2008 | Karnezos |
| 2008/0277800 A1 | | 11/2008 | Hwang et al. |
| 2008/0308950 A1 | | 12/2008 | Yoo |
| 2009/0057862 A1 | | 3/2009 | Ha et al. |
| 2009/0155957 A1 | | 6/2009 | Chen et al. |
| 2009/0230535 A1 | | 9/2009 | Otremba et al. |
| 2010/0112756 A1 | | 5/2010 | Amrine et al. |
| 2010/0127345 A1 | | 5/2010 | Sanders et al. |
| 2010/0133704 A1 | | 6/2010 | Marimuthu et al. |
| 2010/0140779 A1 | | 6/2010 | Lin et al. |
| 2010/0155126 A1 | | 6/2010 | Kunimoto et al. |
| 2010/0155922 A1 | | 6/2010 | Pagaila et al. |
| 2010/0230823 A1 | | 9/2010 | Ihara |
| 2010/0237482 A1 | | 9/2010 | Yang et al. |
| 2010/0243299 A1 | | 9/2010 | Kariya et al. |

(56) References Cited

U.S. PATENT DOCUMENTS

| | | |
|---|---|---|
| 2011/0024902 A1 | 2/2011 | Lin et al. |
| 2011/0024916 A1 | 2/2011 | Marimuthu et al. |
| 2011/0037157 A1 | 2/2011 | Shin et al. |
| 2011/0062592 A1 | 3/2011 | Lee et al. |
| 2011/0068478 A1 | 3/2011 | Pagaila |
| 2011/0090570 A1 | 4/2011 | DeCusatis et al. |
| 2011/0156247 A1 | 6/2011 | Chen et al. |
| 2011/0163391 A1 | 7/2011 | Kinzer et al. |
| 2011/0163457 A1 | 7/2011 | Mohan et al. |
| 2011/0186960 A1 | 8/2011 | Wu et al. |
| 2011/0186977 A1 | 8/2011 | Chi et al. |
| 2011/0193221 A1 | 8/2011 | Hu et al. |
| 2011/0204505 A1 | 8/2011 | Pagaila et al. |
| 2011/0204509 A1 | 8/2011 | Lin et al. |
| 2011/0215464 A1 | 9/2011 | Guzek et al. |
| 2011/0241218 A1 | 10/2011 | Meyer et al. |
| 2011/0260336 A1 | 10/2011 | Kang et al. |
| 2011/0278736 A1 | 11/2011 | Lin et al. |
| 2011/0285005 A1 | 11/2011 | Lin et al. |
| 2012/0032340 A1 | 2/2012 | Choi et al. |
| 2012/0038053 A1 | 2/2012 | Oh et al. |
| 2012/0049346 A1 | 3/2012 | Lin et al. |
| 2012/0056312 A1 | 3/2012 | Pagaila et al. |
| 2012/0139068 A1 | 6/2012 | Stacey |
| 2012/0161315 A1 | 6/2012 | Lin et al. |
| 2012/0208319 A1 | 8/2012 | Meyer et al. |
| 2012/0217643 A1 | 8/2012 | Pagaila et al. |
| 2012/0273960 A1 | 11/2012 | Park et al. |
| 2012/0319294 A1 | 12/2012 | Lee et al. |
| 2012/0319295 A1 | 12/2012 | Chi et al. |
| 2013/0009322 A1 | 1/2013 | Conn et al. |
| 2013/0009325 A1 | 1/2013 | Mori et al. |
| 2013/0044554 A1 | 2/2013 | Goel et al. |
| 2013/0062760 A1 | 3/2013 | Hung et al. |
| 2013/0062761 A1 | 3/2013 | Lin et al. |
| 2013/0093078 A1 | 4/2013 | Lin et al. |
| 2013/0105991 A1 | 5/2013 | Gan et al. |
| 2013/0111123 A1 | 5/2013 | Thayer |
| 2013/0175702 A1 | 7/2013 | Choi |
| 2013/0181325 A1 | 7/2013 | Chen et al. |
| 2013/0182402 A1 | 7/2013 | Chen et al. |
| 2013/0234322 A1 | 9/2013 | Pendse |
| 2013/0256836 A1 | 10/2013 | Hsiao et al. |
| 2013/0307155 A1 | 11/2013 | Mitsuhashi |
| 2013/0334697 A1 | 12/2013 | Shin et al. |
| 2014/0091473 A1 | 4/2014 | Len et al. |
| 2014/0103488 A1 | 4/2014 | Chen et al. |
| 2014/0110856 A1 | 4/2014 | Lin |
| 2014/0183731 A1 | 7/2014 | Lin et al. |
| 2014/0264836 A1 | 9/2014 | Chun et al. |
| 2014/0367828 A1 | 12/2014 | Colonna et al. |
| 2015/0093881 A1 | 4/2015 | Chen et al. |
| 2015/0096798 A1 | 4/2015 | Uzoh |
| 2015/0102464 A1 | 4/2015 | Kang et al. |
| 2015/0115464 A1 | 4/2015 | Yu et al. |
| 2015/0115470 A1 | 4/2015 | Su et al. |
| 2015/0155203 A1 | 6/2015 | Chen et al. |
| 2015/0187742 A1 | 7/2015 | Kwon et al. |
| 2015/0212420 A1 | 7/2015 | Chang et al. |
| 2015/0303174 A1 | 10/2015 | Yu et al. |
| 2015/0325556 A1 | 11/2015 | Lai et al. |
| 2016/0148991 A1 | 5/2016 | Erickson et al. |
| 2016/0293577 A1 | 10/2016 | Yu et al. |
| 2016/0322288 A1 | 11/2016 | Lin |
| 2016/0322330 A1 | 11/2016 | Lin et al. |
| 2017/0309596 A1 | 10/2017 | Yu et al. |
| 2019/0057933 A1 | 2/2019 | Lin et al. |

FOREIGN PATENT DOCUMENTS

| | | |
|---|---|---|
| CN | 102157391 A | 8/2011 |
| KR | 20110025699 A | 3/2011 |
| KR | 101099578 B1 | 12/2011 |
| KR | 20120060486 A | 6/2012 |
| KR | 1020120075855 A | 7/2012 |
| KR | 1020120094182 A | 8/2012 |
| KR | 1020120098844 A | 9/2012 |
| TW | 200919632 A | 5/2009 |
| TW | 201230266 A | 7/2012 |
| WO | 2011090570 A2 | 7/2011 |

OTHER PUBLICATIONS

Zhang, Y. et al., "Lead-Free Bumping and Its Challenges," IWPLC Conference Proceedings, Oct. 10, 2004, 8 pages.

* cited by examiner

SEMICONDUCTOR DEVICE WITH DISCRETE BLOCKS

PRIORITY CLAIM

This application is a continuation of U.S. patent application Ser. No. 17/567,435, entitled "Semiconductor Device with Discrete Blocks," filed on Jan. 3, 2022, which is a continuation of U.S. patent application Ser. No. 16/715,488, entitled "Semiconductor Device with Discrete Blocks," filed on Dec. 16, 2019, now U.S. Pat. No. 11,217,562, issued on Jan. 4, 2022, which is a continuation of U.S. patent application Ser. No. 16/017,060, entitled "Semiconductor Device with Discrete Blocks," filed on Jun. 25, 2018, now U.S. Pat. No. 10,510,727, issued on Dec. 17, 2019, which application is a continuation of U.S. patent application Ser. No. 15/401,851, entitled "Semiconductor Device with Discrete Blocks," filed on Jan. 9, 2017, now U.S. Pat. No. 10,008,479, issued on Jun. 26, 2018, which application is a divisional of U.S. patent application Ser. No. 14/886,775, entitled "Semiconductor Device with Discrete Blocks," filed on Oct. 19, 2015, now U.S. Pat. No. 9,543,278, issued on Jan. 10, 2017, which application is a divisional of U.S. patent application Ser. No. 13/608,946, entitled "Semiconductor Device with Discrete Blocks," filed on Sep. 10, 2012, now U.S. Pat. No. 9,165,887, issued on Oct. 20, 2015, which applications are incorporated herein by reference.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in the minimum feature size, allowing more components to be integrated into a given chip area. These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

One packaging technique that has been developed is Package-on-Package (PoP). As the name implies, PoP is a semiconductor packaging innovation that involves stacking one package on top of another package. For example, a PoP device may combine vertically discrete memory and logic ball grid array (BGA) packages. In PoP package designs, the top package may be interconnected to the bottom package through peripheral solder balls, wire bonding, or the like.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a Package-on-Package (PoP) structure with integrated passive devices (IPDs). Specific embodiments will highlight the use of discrete blocks, such as discrete silicon or $SiO_2$ blocks, encased within a molding compound. The discrete blocks may be used to form IPDs, through vias (TVs) (e.g., through-silicon vias (TSVs), and/or the like, to provide electrical connections in PoP applications. Other embodiments may be used in other applications, such as with interposers, packaging substrates, or the like.

Figure 1A:
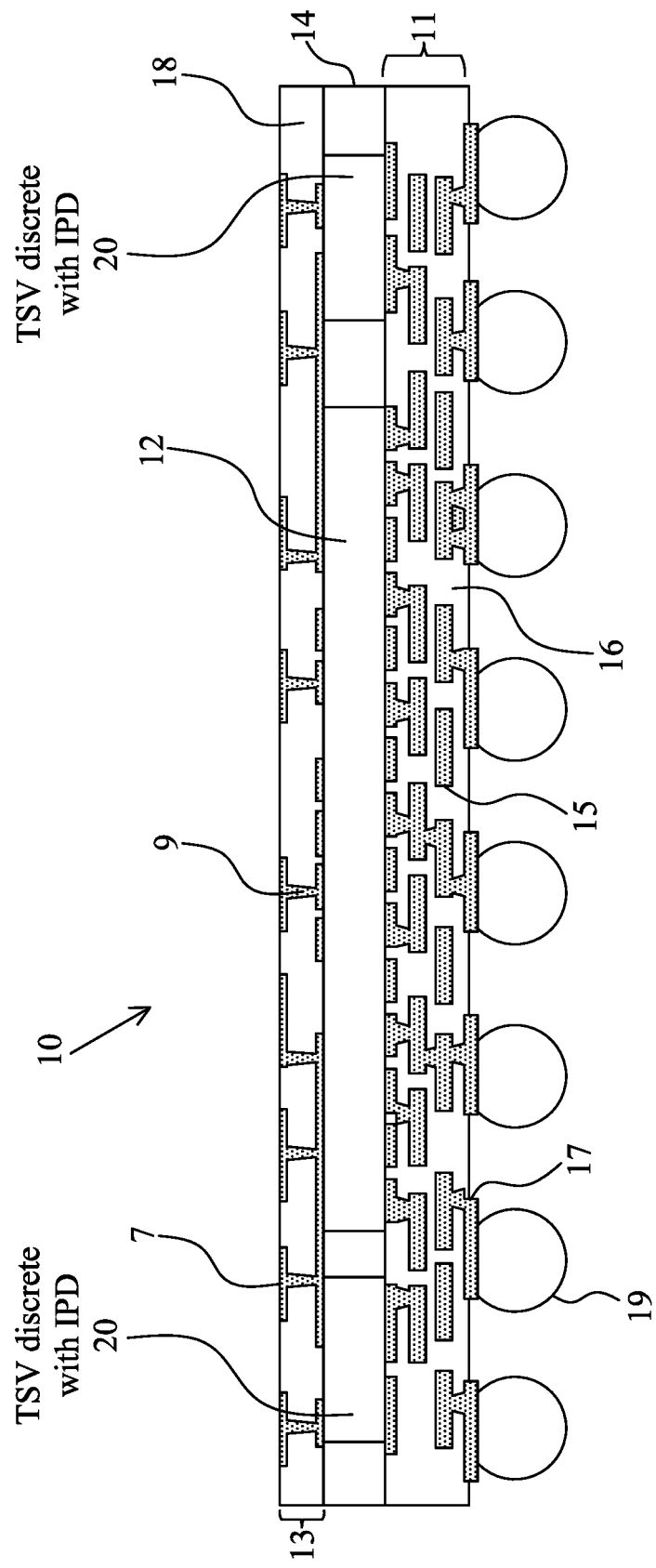
FIGS. 1a-1c depict cross-sectional and plan views of an embodiment.

FIG. 1a depicts a cross-sectional view of a first package 10 in accordance with an embodiment. The first package 10 comprises a first interconnect layer 11 having one or more dies (one die 12 being shown) coupled thereto. The first interconnect layer 11 may comprise one or more layers of dielectric material 16 with conductive features (illustrated as conductive features 15) formed therein. In an embodiment, the layers of dielectric material 16 are formed of a photo-sensitive material such as polybenzoxazole (PBO), polyimide (PI), benzocyclobutene (BCB), or the like, which may be easily patterned using a lithography mask similar to a photo resist. In alternative embodiments, the layers of dielectric material 16 may be formed of a nitride such as silicon nitride, an oxide such as silicon oxide, phosphosilicate glass (PSG), borosilicate glass (BSG), boron-doped phosphosilicate glass (BPSG), or the like. In an alternative embodiment the first interconnect layer 11 may comprise an interposer or packaging substrate, such as a silicon interposer, organic substrate, a laminate substrate (e.g., a 1-2-1 laminate substrate), or the like. As illustrated in FIG. 1a, the first interconnect layer 11 provides electrical connections between opposing sides and may act as a redistribution layer (RDL). A first set of external contact pads 17 provide an external electrical connection using, for example, solder balls 19.

The die 12 is laterally encased in a material layer, such as a molding compound 14, which may have one or more connection blocks 20 positioned therein. As illustrated in FIG. 1a, the connections blocks 20 are aligned along a major axis of the die 12, and the molding compound 14 is interposed between the die 12 and the connection blocks 20. The connection blocks 20 may include, for example, through vias (TVs) and/or integrated passive devices (IPDs). Generally, as described in greater detail below, the connection blocks 20 provide a structural material that allows a higher density of structures, such as TVs and/or IPDs, to be formed therein. In an embodiment, the connection blocks 20 comprise silicon, silicon dioxide, glass, and/or the like.

Over the die 12, molding compound 14, and the connection blocks 20 may be a second interconnect layer 13. The second interconnect layer 13 may comprise one or more layers of dielectric material 18 with conductive features (illustrated as conductive features 9) formed therein. In an embodiment, the layers of dielectric material 18 are formed of a photo-sensitive material such as polybenzoxazole (PBO), polyimide (PI), benzocyclobutene (BCB), or the like, which may be easily patterned using a lithography mask similar to a photo resist. In alternative embodiments, the layers of dielectric material 18 may be formed of a nitride such as silicon nitride, an oxide such as silicon oxide, phosphosilicate glass (PSG), borosilicate glass (BSG), boron-doped phosphosilicate glass (BPSG), or the like. In an alternative embodiment the second interconnect layer 13 may comprise an interposer or packaging substrate, such as a silicon interposer, organic substrate, a laminate substrate (e.g., a 1-2-1 laminate substrate), or the like. Additionally, the second interconnect layer 13 may include a set of second external contacts 7 (provided through conductive features 9) for connection to another device, such as a die, a stack of dies, a package, an interposer, and/or the like. The another device may connect via solder bumps/balls, wire bonding, or the like through the second external contacts 7.

As illustrated in FIG. 1*a*, and discussed in greater detail below, electrical components may be electrically coupled to the upper surface of the second interconnect layer 13. The second interconnect layer 13 (via the conductive features 9), which may act as a RDL, provides electrical connections between those electrical components and the TVs/IPDs positioned within the connection blocks 20. The first interconnect layer 11 in turn provides an electrical connection between the connection blocks 20 and the die 12 and/or the first set of external contact pads 17, as well as providing an electrical connection between the die 12 and the first set of external contact pads 17. Solder balls 19, which may be part of, for example, a ball grid array (BGA), may be attached to another substrate, such as a wafer, packaging substrate, PCB, die, or the like.

Embodiments such as that illustrated in FIG. 1*a* comprise connection blocks 20 that may allow structures such as the through vias and IPDs to be formed in a different type of material than the molding compound 14, thereby providing different performance characteristics. The connection blocks 20 may comprise one or more TVs, e.g., through-silicon vias (TSVs), connecting the second interconnect layer 13 to the first interconnect layer 11. In addition, the connection blocks 20 may comprise one or more integrated passive devices (IPDs), such as integrated capacitors, integrated resistors, or the like. In the case of the TVs and the IPDs, the use of a silicon block allows the vias and devices to be placed closer together. That is to say, the fineness of the pitch of the TVs and the IPDs is increased, allowing greater density of via and passive device integration. In another embodiment the block 20 may comprise silicon dioxide (SiO$_2$) which provides similar improvements to that of silicon. For example, by using silicon or silicon oxide a pitch of the TVs may be reduced down to about 60 μm from a pitch through molding compound which would be greater than 100 μm.

Figure 1B:
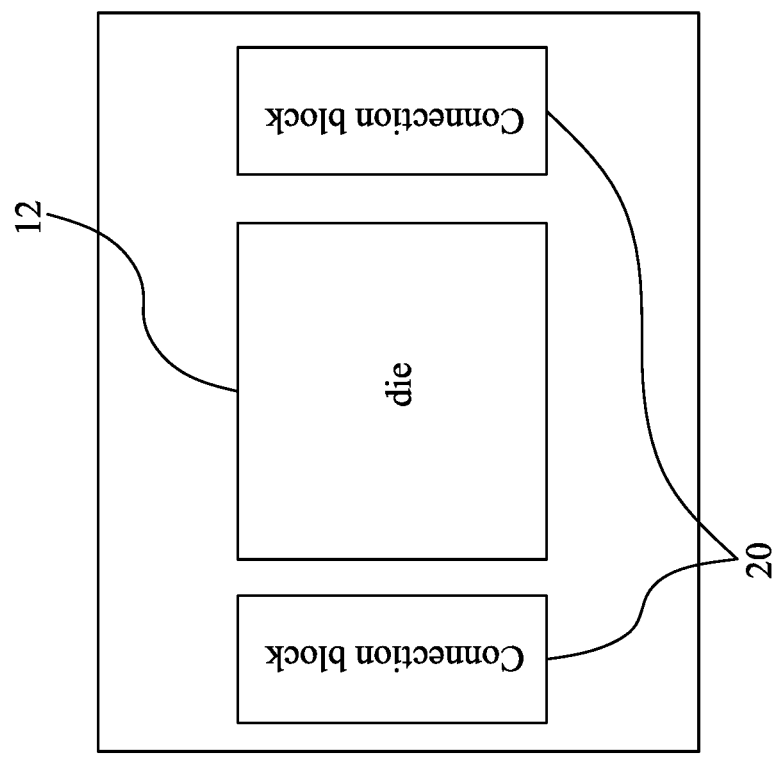

FIG. 1B illustrates a plan view of the embodiment illustrated in FIG. 1*a*. As illustrated, a single die 12 is located between two connection blocks 20. Additionally, the molding compound 14 surrounds the single die 12 and the two connection blocks 20, thereby separating the die 12 from the two connection blocks 20. In such a layout the two connection blocks 20 provide additional support and routing options to the die 12 through the molding compound 14, thereby allowing more flexibility.

Figure 1C:
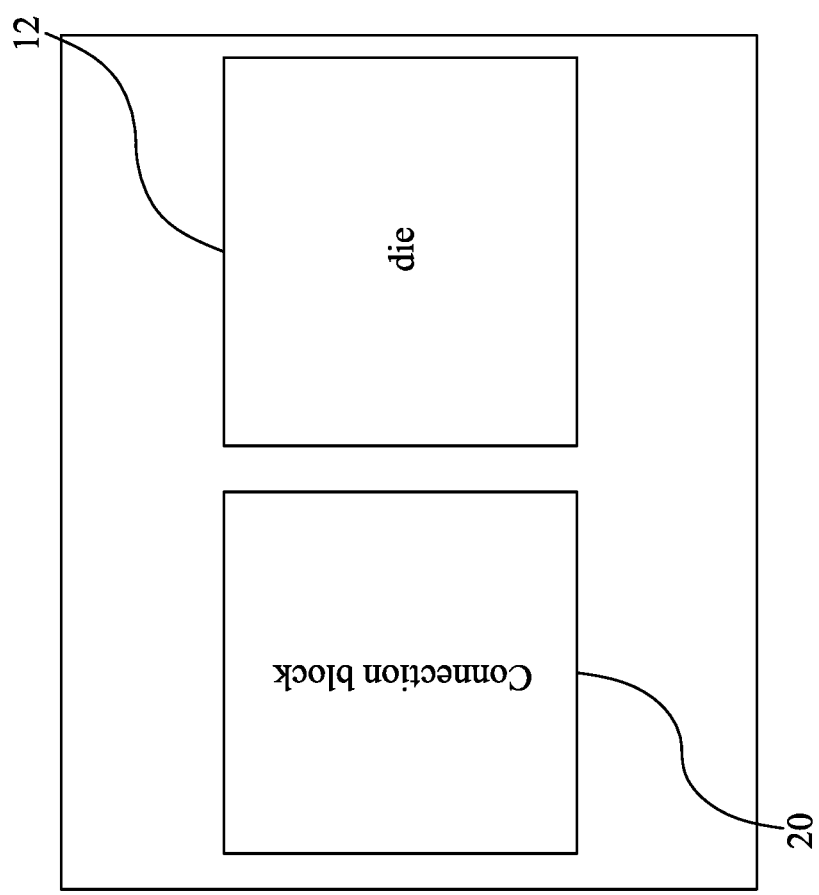

FIG. 1C illustrates a plan view of another embodiment in which a single die 12 is utilized along with a single connection block 20. In this embodiment the die 12 and the connection block 20 are aligned with each other side by side, with the connection block 20 aligned along a single side of the die 12. Additionally, in other embodiments the connection blocks 20 may form a ring (either continuous or broken) around the die 12. Any suitable arrangement of the die 12 and the one or more connection blocks 20 may alternatively be utilized.

Figure 2A:
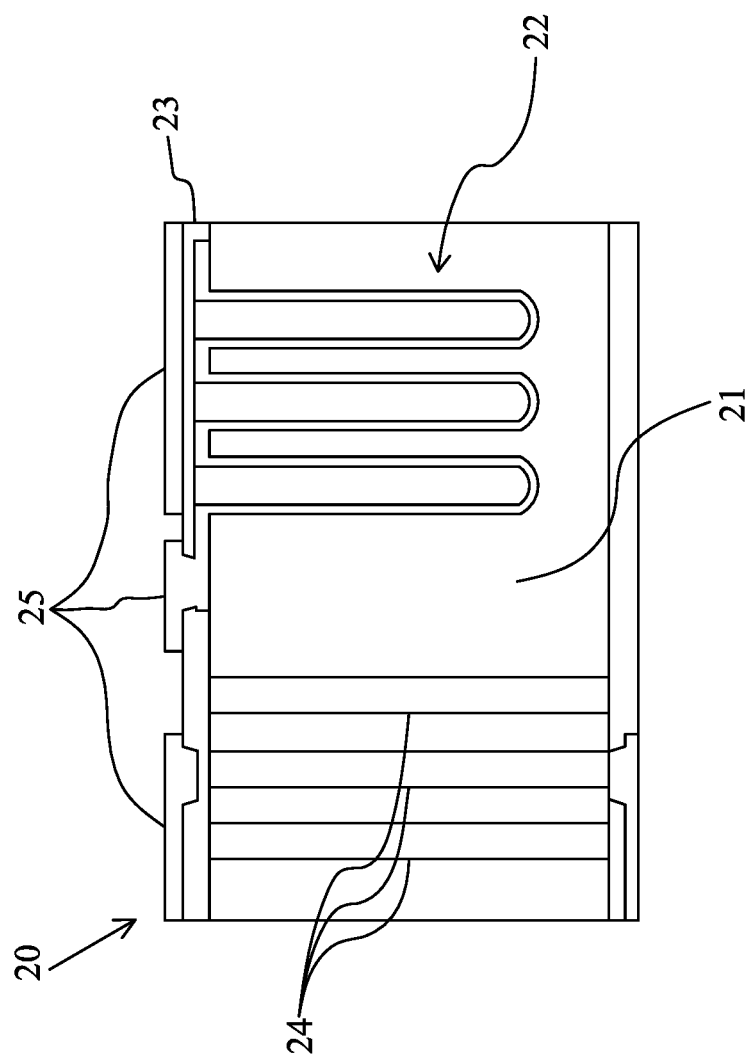
FIGS. 2a-2c depict an enlarged cross-sectional view of a block in accordance with embodiments.

FIG. 2*a* depicts an embodiment of the connection block 20. The connection block 20 comprises a structural material 21, such as silicon, silicon dioxide (SiO$_2$), or the like. Holes in the structural material 21 form one or more TVs 24 and one or more integrated passive devices (IPDs) 22, such as a trench capacitor as illustrated in FIG. 2. The TVs 24 are filled with a conductive material 25, such as a metal, to provide contacts from a first side of the block 20 to a second side of the block 20. In an embodiment in which the IPD 22 comprises a capacitor or a resistor, the IPD 22 may be lined separately with conductive material 25 and filled with a filler material 23. The filler material 23 comprises either a dielectric to form an integrated capacitor or a resistive material to form an integrated resistor. The TVs 24 and the IPDs 22 may include other components, such as adhesion layers, barrier layers, or the like, and may include multiple layers.

Figure 2B:
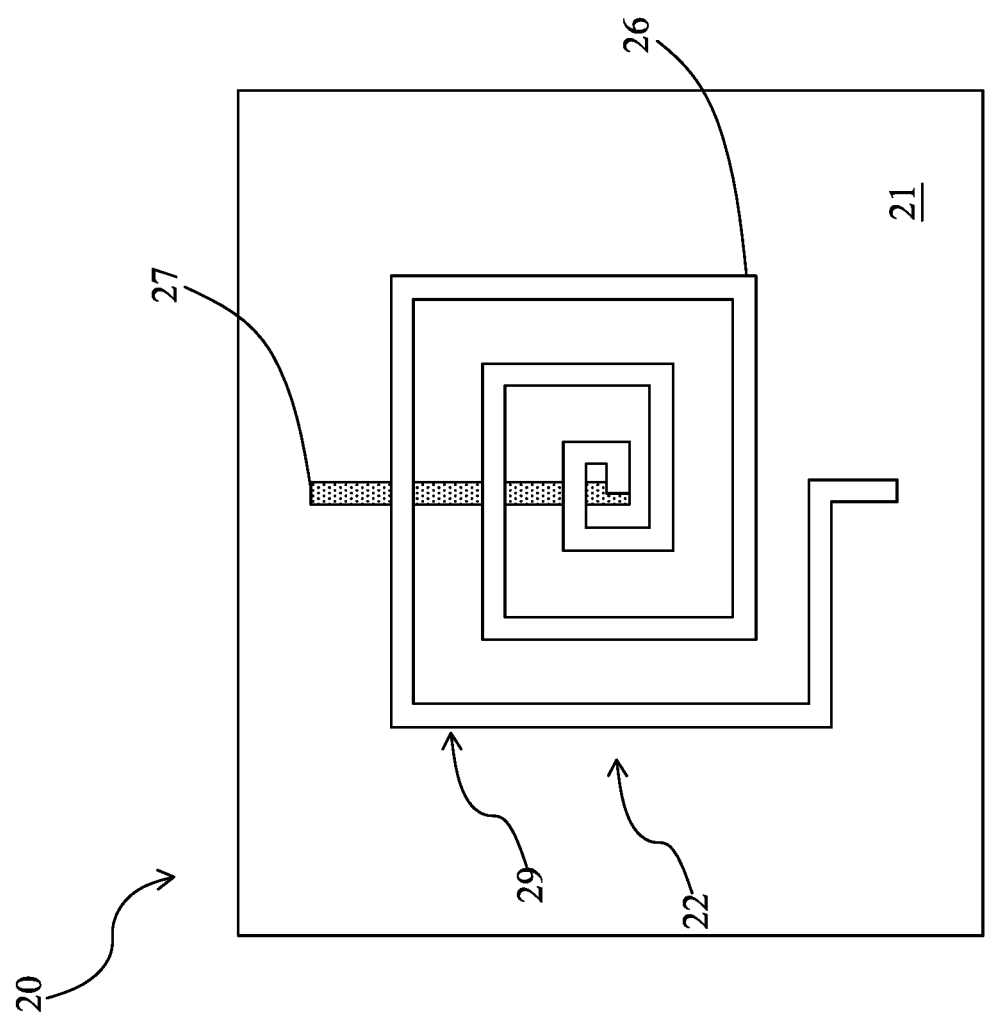
Figure 2C:
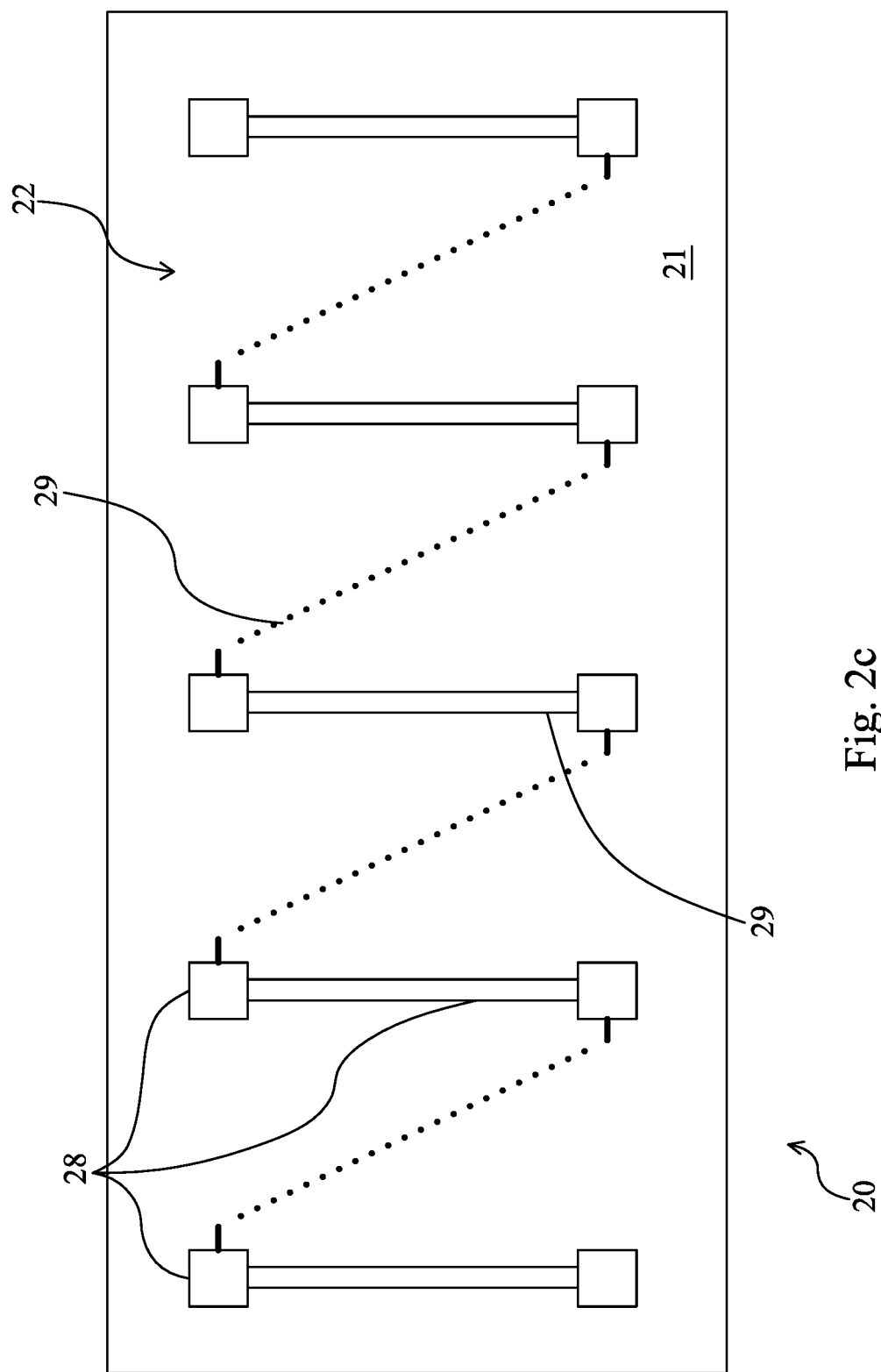

FIGS. 2*b*-2*c* illustrate that, in another embodiment the IPD 22 comprises an inductor 29. FIG. 2*b* illustrates one embodiment in which the inductor 29 is formed in a metallization layer 27 on a single side of the connection block 20. The metallization layer 27 may be formed on the connection block 20 either facing the first interconnect layer 11 or facing away from the first interconnect layer 11. The inductor 29 may be formed within the first metallization layer 27 using suitable photolithographic, deposition, and polishing processes such as damascene processes.

FIG. 2*c* illustrates an alternative embodiment in which, rather than being formed in a single metallization layer 27 on one side of the connection block 20, the inductor 29 may be formed through the connection block 20. For example, TVs may be formed within the connection block 20 in order to provide vertical sections of the inductor 29, while the vertical sections of the inductor 29 may be connected with each other by forming connections in the metallization layers 27 located on both sides of the connection block 20.

In an embodiment in which the connection blocks 20 are formed of silicon, any suitable semiconductor processing techniques may be used to form the connection blocks 20. For example, photolithography techniques may be utilized to form and pattern a mask to etch vias and trenches in the silicon in accordance with a desired pattern. The trenches may be filled with the appropriate conductive, dielectric, and/or resistive materials using suitable techniques, including chemical vapor deposition, atomic layer deposition, electro-plating, and/or the like. Thinning techniques may be utilized to perform wafer thinning to expose the TVs along a backside. Thereafter, a singulation process may be performed to form the connection blocks 20 as illustrated in FIG. 2. The connection blocks 20 may be of any shape, such as square, rectangular, the like. Additionally, one or more connection blocks 20 may be utilized. For example, in an embodiment, a single connection block 20 is utilized, whereas in other embodiments, multiple connection blocks 20 may be utilized. The connection blocks 20 may extend alongside one or more sides of the die 12, and may form a ring (continuous or broken) around the die 12.

Figure 3:
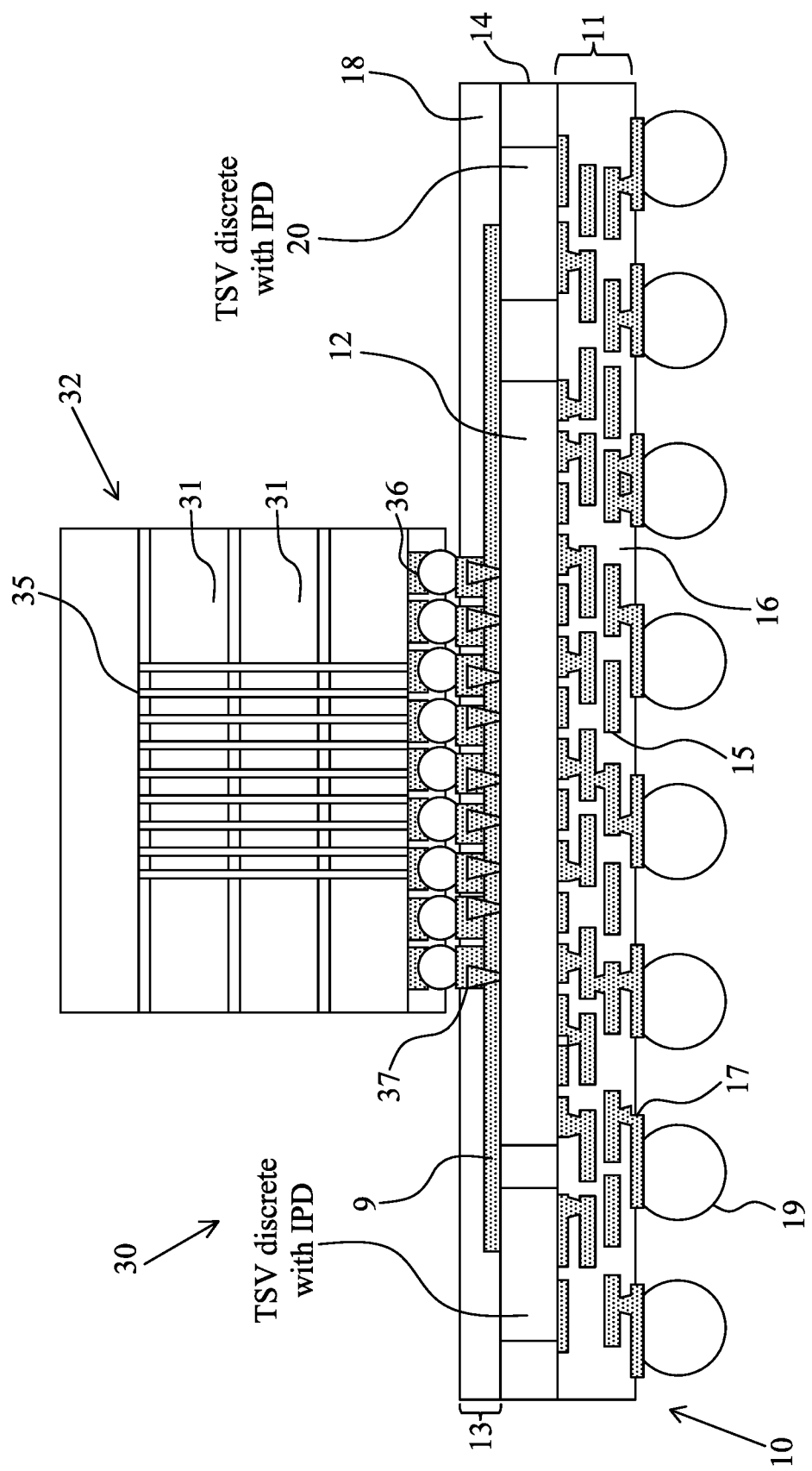
FIG. 3 depicts a cross-sectional view of an embodiment involving a PoP device.

FIG. 3 depicts an embodiment of a package on package (PoP) device 30. As will be more fully explained below, the PoP device 30 provides an innovative package-on-package structure with integrated, or built-in, passive devices incorporated into the connection blocks 20. As such, the PoP device 30 offers improved electrical performance and a higher operation frequency relative to a standard PoP device. Additionally, the decreased pitch of the TVs and the IPDs in the block 20 allow increased integration density. As shown in FIG. 3, the PoP device 30 generally includes a second package 32 coupled to the first package 10 through solder balls 36 connected to solder ball lands 37 in, for example, a BGA arrangement. However, the first and second package can be connected through other means such as via solder bumps, wire bonding, or the like.

In an embodiment, the second package 32 includes several stacked memory chips 31. The memory chips 31 may be electrically coupled to each other through, for example, through vias, wire bonds, or the like, represented in FIG. 2 by reference numeral 35. While several memory chips 31 are depicted in FIG. 3, in an embodiment the second package 32 may include a single memory chip 31. The second package 32 may also incorporate other chips, dies, packages, or electronic circuitry depending on the intended use or performance needs of the PoP device 30.

As described above, in the embodiment depicted in FIG. 1a and FIG. 3 the first interconnect layer 11 comprises at least one layer of dielectric material 16. In an alternative embodiment the first interconnect layer 11 may be replaced by a suitable semiconductor material such as silicon. If silicon is used as a substrate in place of the dielectric material 16, a passivation layer and a molding layer may be included between the silicon and the solder balls 19 of the BGA. These additional layers may be omitted when, e.g., the interconnect layer is formed from a dielectric material 16.

The first package 10 also includes a molding compound 14 encasing the die 12 and the connection blocks 20. The molding compound 14 may be formed from a variety of suitable molding compounds. As depicted in FIG. 2, the connection block 20 provides the IPDs as well as the TVs for the interconnection between the first package 10 and the second package 32. As noted above, the solder bump lands 37 are employed to mount the second package 32 and provide electrical connection through the conductive features 9, embedded or supported by the second interconnect layer 13, to the TVs or IPDs in the connection block 20 that is encased in the molding compound 14.

Figure 4A:
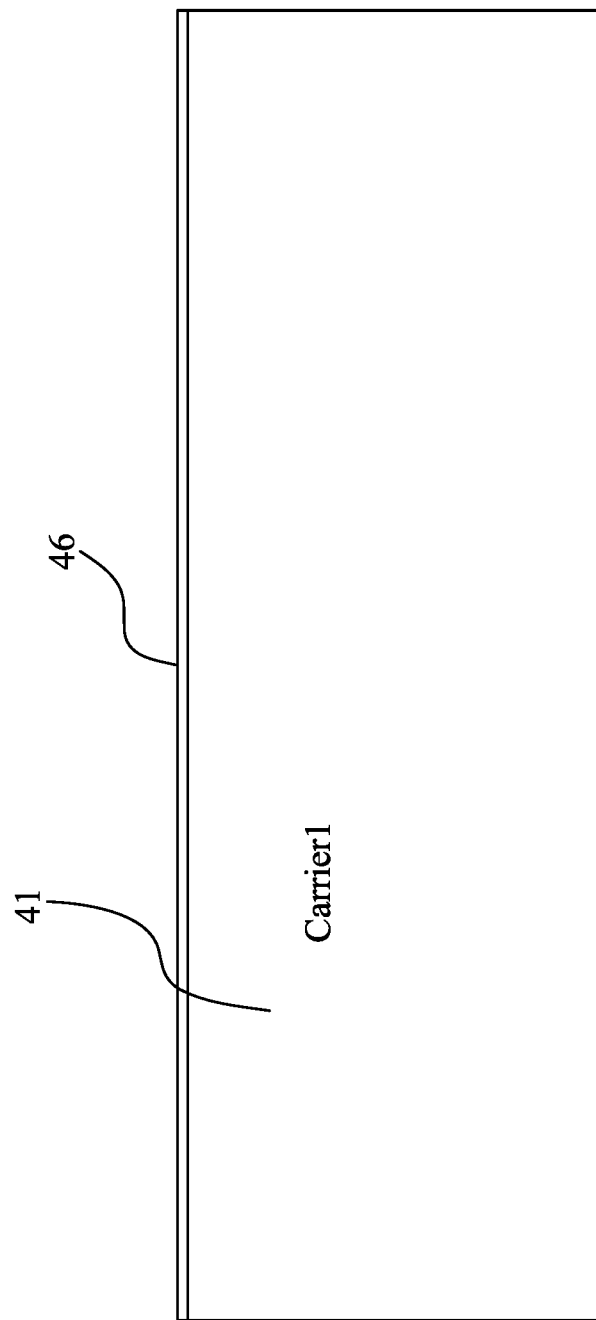
FIGS. 4a-4j depict a process flow for the construction of an embodiment.
Figure 4B:
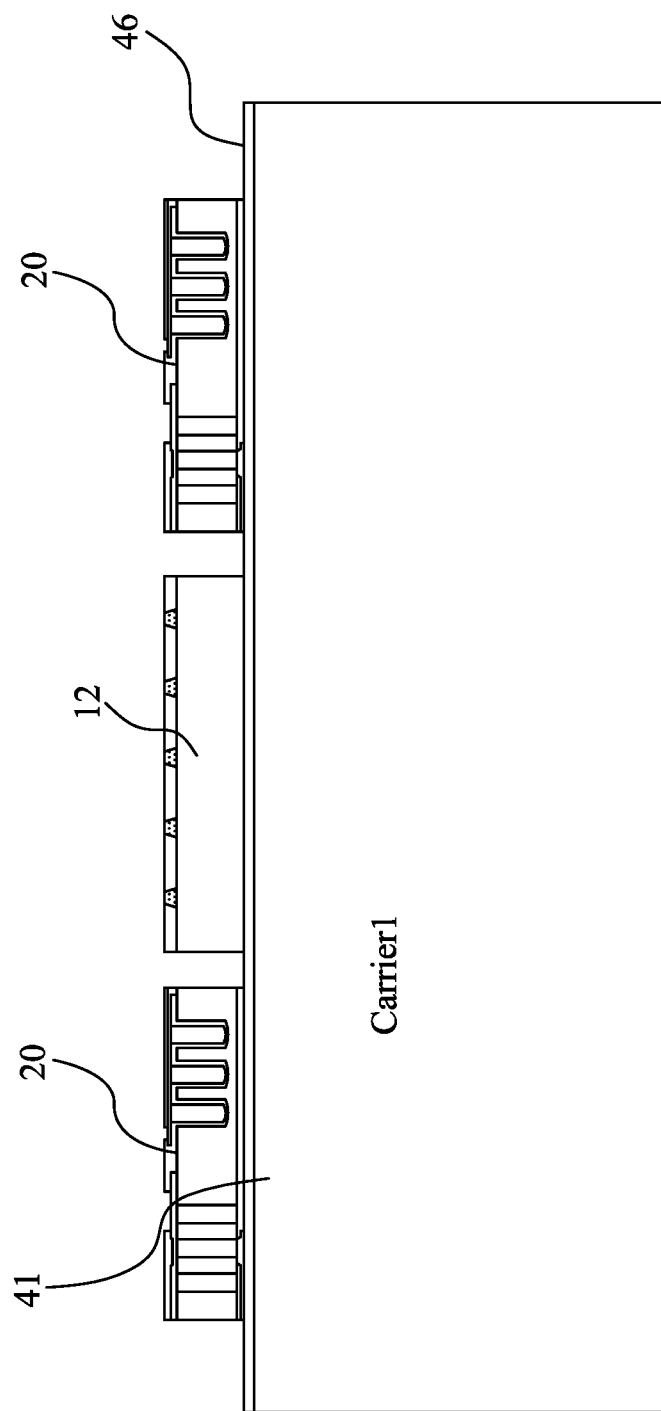

FIGS. 4a-4j depict various intermediate stages in a method for forming an embodiment. Referring first to FIG. 4a, a first carrier 41, e.g., a glass carrier, with a release film coating 46 formed thereon is shown. In FIG. 4b, connection blocks 20 and a die 12 are attached to the first carrier 41 on surface with the release film coating 46. The release film coating 46 may comprise an adhesive film ultra-violet (UV) glue, or may be formed of other known adhesive materials. In an embodiment, the release film coating 46 is dispensed in a liquid form onto the first carrier 41. In alternative embodiments, the release film coating 46 is pre-attached onto the back surfaces of die 12 and the connection blocks 20, which are then attached to the first carrier 41.

As illustrated in FIG. 4b, the connection blocks 20 may be formed separately and placed on the first carrier 41. In this embodiment, the connection blocks 20 may be formed from a wafer, e.g., a silicon wafer, using any suitable semiconductor processing techniques, such as photolithography, deposition, etching, grinding, polishing, and/or the like, to form the through vias, IPDs, and/or the like for a particular application. The connection blocks may be separated from the wafer and placed as, for example, shown in FIG. 4b.

Figure 4C:
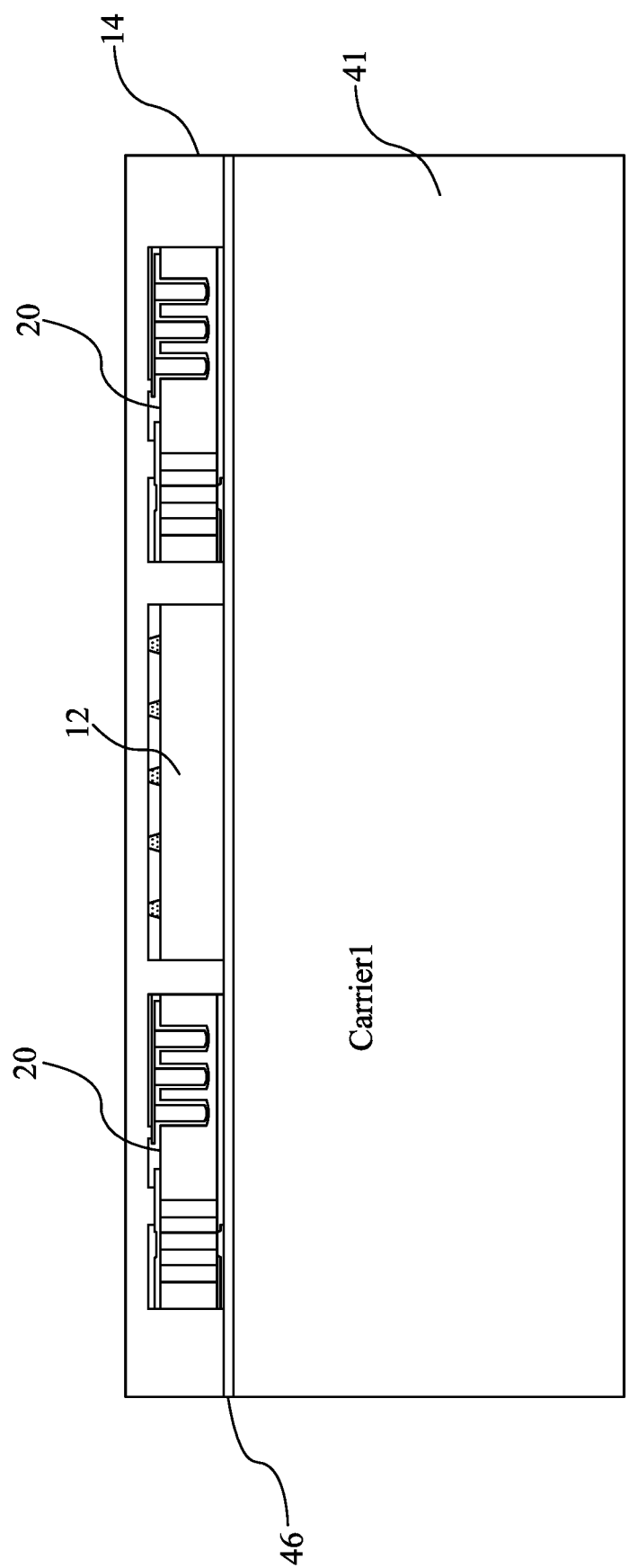

FIG. 4c illustrates the molding compound 14 disposed encasing the die 12 and the connection blocks 20. In an embodiment, the molding compound 14 comprises a molding compound formed on the structures shown through compression molding, for example. In another embodiment, a polymer-comprising material, such as a photo-sensitive material such as PBO, polyimide, BCB, or the like, may be used. The molding compound 14 may be applied in a liquid form, which is dispensed and then cured. A top surface of the molding compound 14 is higher than the top surfaces of the die 12 and the connection blocks 20.

Figure 4D:
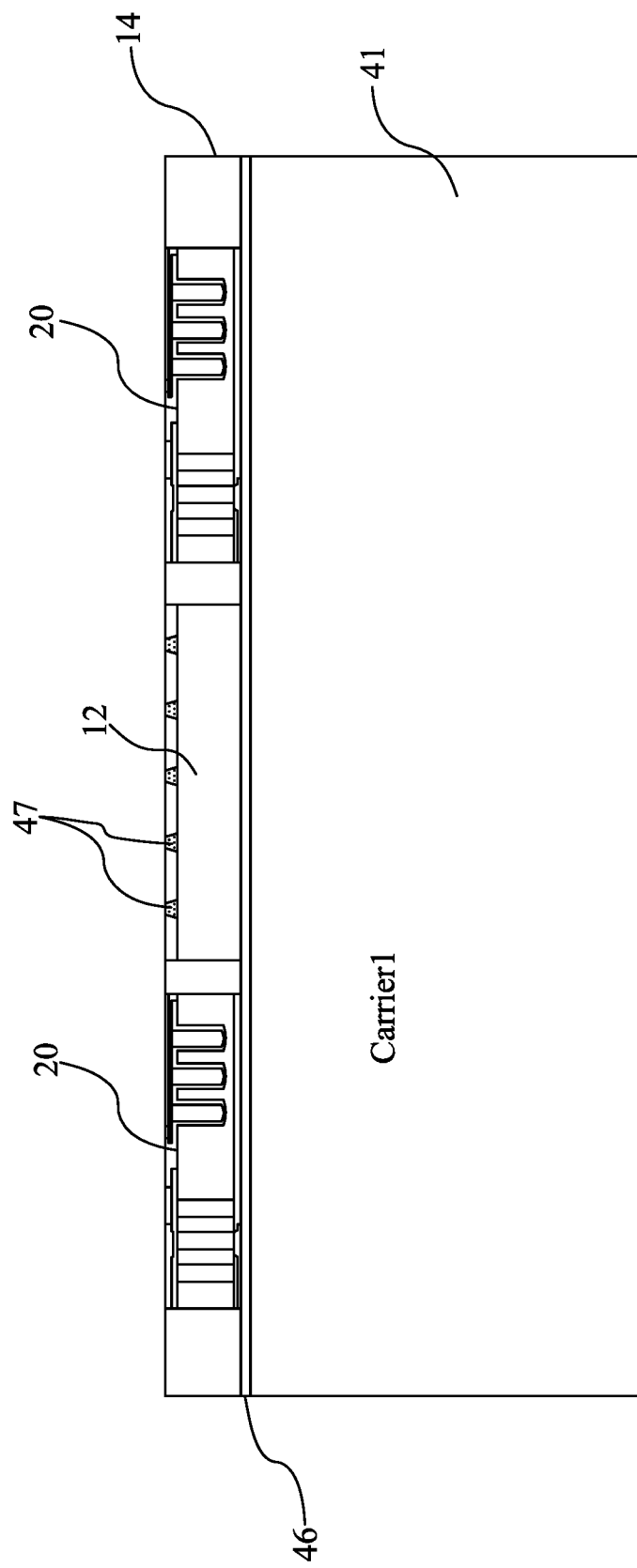

Shown in FIG. 4d, a wafer thinning process comprising a grinding and/or polishing is performed to planarize the top surface. The thinning process reduces and may substantially eliminate any unevenness in the top surface. The molding compound 14 comprising portions covering top surfaces of die 12 and connection blocks 20 is removed by the thinning, thereby exposing the TVs and/or the IPDs formed within the connection blocks 20.

Figure 4E:
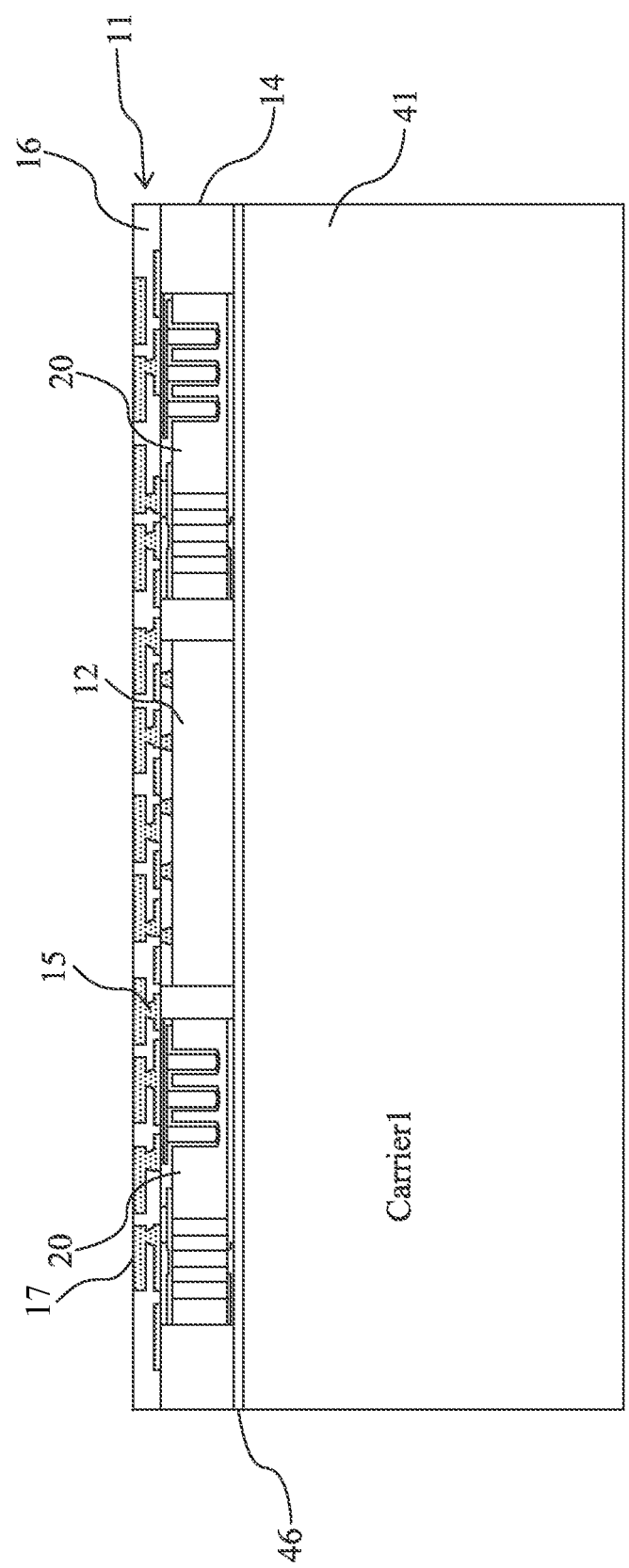

In FIG. 4e, the first interconnect layer 11 is formed over molding compound 14, connection blocks 20, and die 12. In an embodiment the first interconnect layer 11 comprises alternating layers of dielectric material 16 with layers of conductive features 15 to comprise a RDL. The bottom surface of the first interconnect layer 11 may be in contact with the top surface of the die 12, the connection blocks 20, and the molding compound 14. The dielectric material 16 may comprise many different types of materials as described earlier in reference to FIG. 1a. The conductive features 15 comprising a RDL may include lower portions whose bottoms are electrically coupled to the through vias 24 and IPDs 22 in the connection blocks 20 as shown in FIG. 2. The RDL with conductive features 15 may also include top regions with external contact pads 17.

In accordance with some embodiments, the formation of the first interconnect layer 11 may include forming a dielectric material, etching and removing portions of the dielectric material, forming an under-bump-metallurgy (UBM, not shown) over the dielectric material, forming and patterning a photo resist (not shown) to cover portions of the UBM, and plating a metallic material to form the first set of external contact pads 17. The exposed portions of the UBM are then removed. The first set of external contact pads 17 may be formed of copper, aluminum, tungsten, or the like.

Figure 4F:
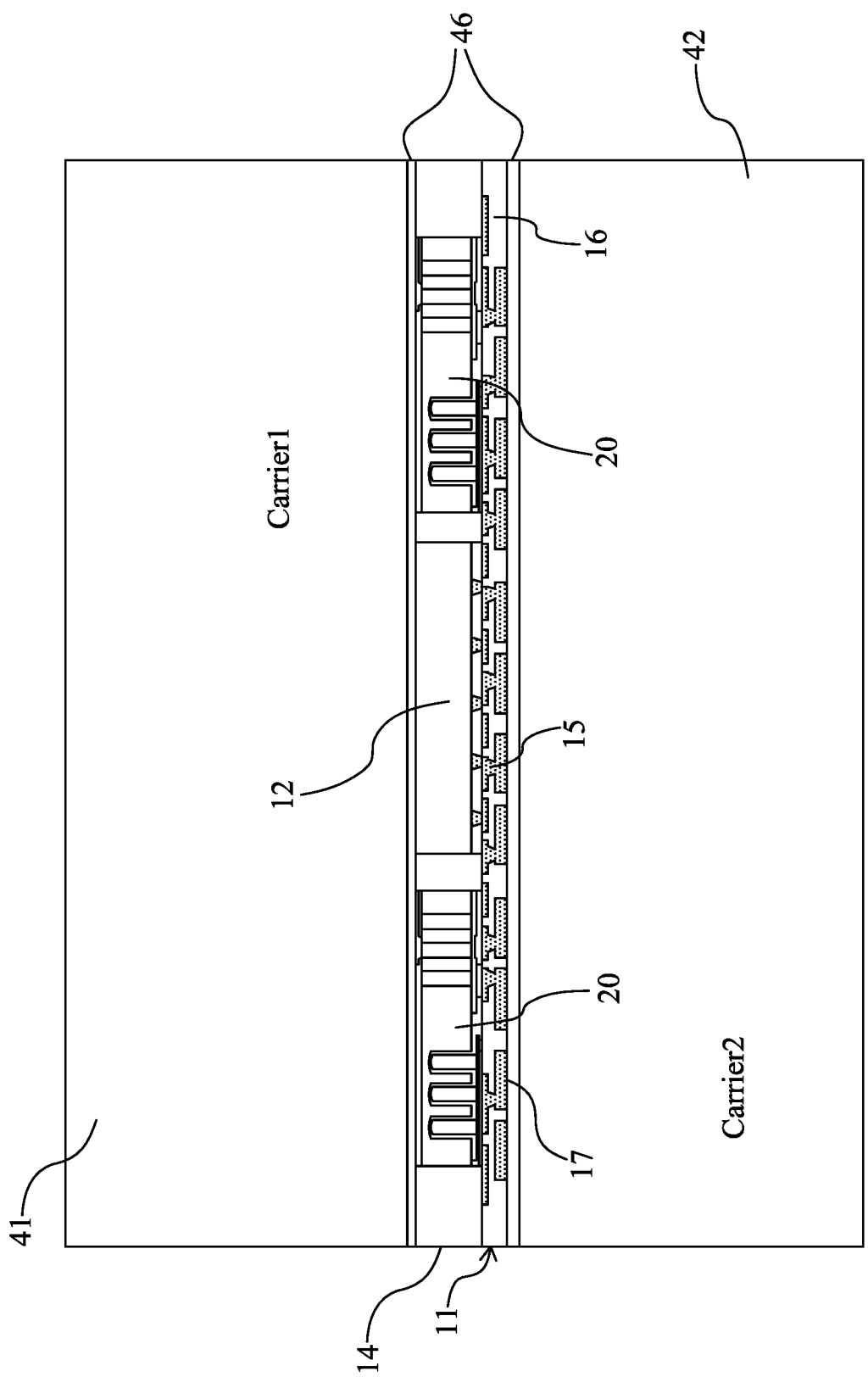

FIG. 4f shows a second carrier 42 with a release film coating 46 attached to the top side of the first interconnect layer 11. The release film coating 46 of the second carrier 42 may be similar to the release film coating 46 of the first carrier 41. The wafer is then flipped over.

Figure 4G:
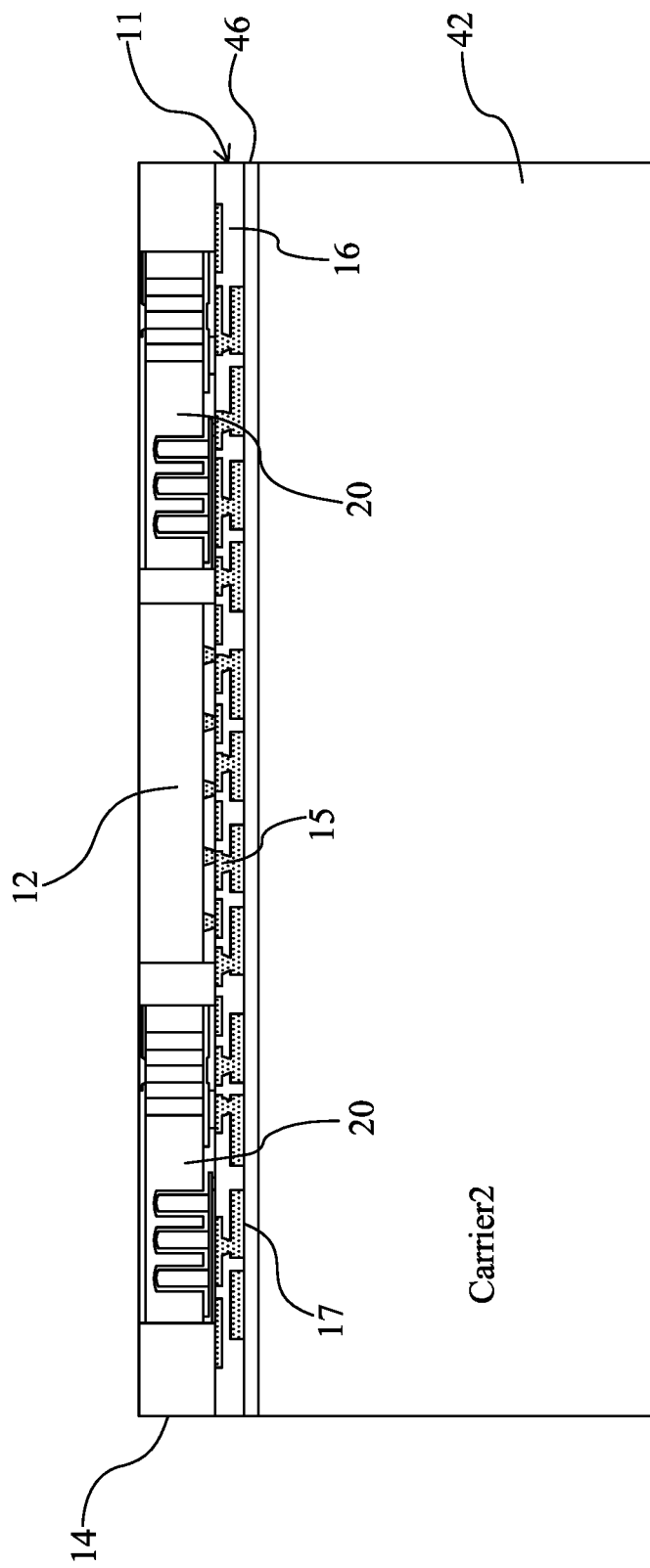

In FIG. 4g, the first carrier 41 is de-bonded, for example, by exposing release film coating 46 to a UV light, causing it to lose its adhesive property. The release film coating 46 is also removed. An optional backside thinning process may be performed to thin and planarize the surface of the wafer, possibly to expose through vias formed in the die 12.

Figure 4H:
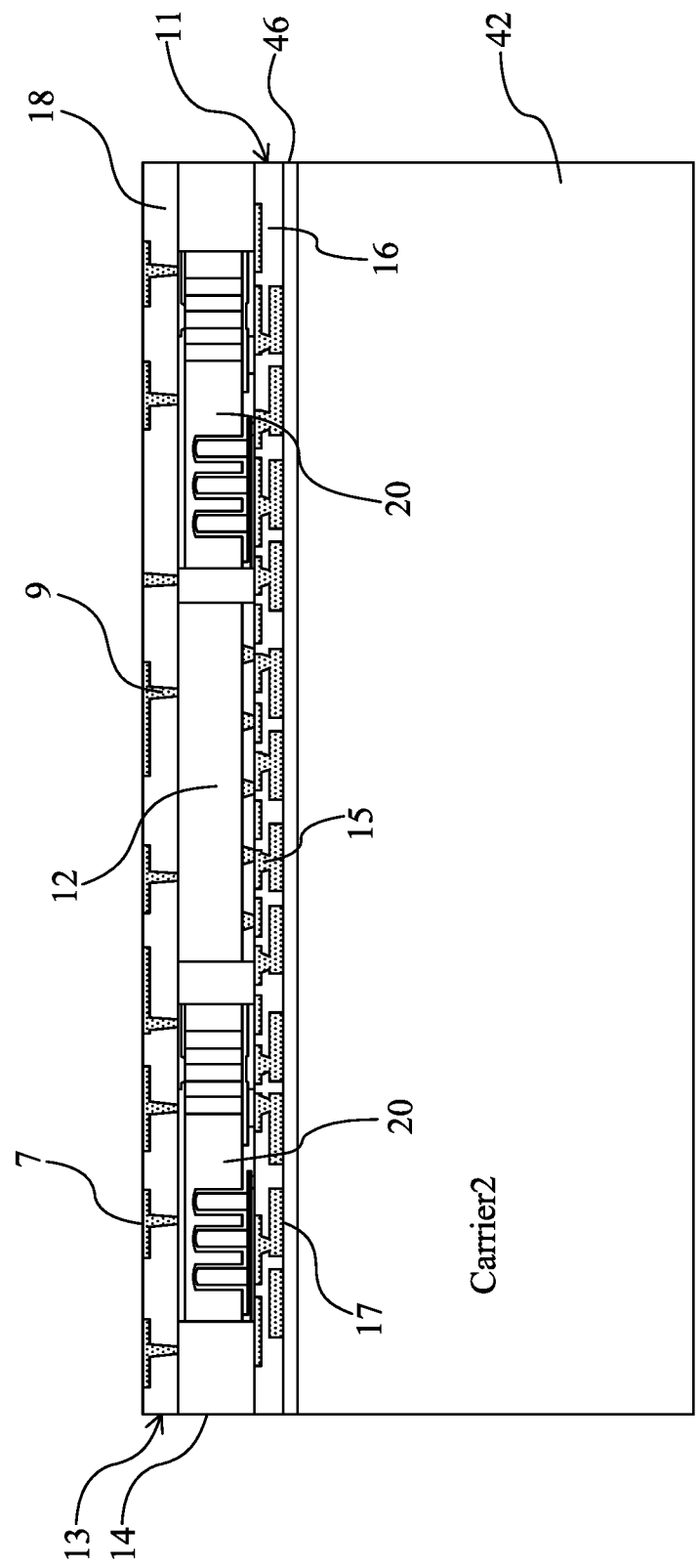

FIG. 4h depicts the second interconnect layer 13 formed over the die 12 and connection blocks 20. The second interconnect layer 13 may be constructed of dielectric materials 18 similar to dielectric materials 16 as described in reference to FIG. 1a. The second interconnect layer 13 may be formed in a way similar to the first interconnect layer 11. The second interconnect layer 13, in an embodiment a RDL, provides interconnections between the TVs in the connection blocks 20 and the external contacts 7.

Figure 4I:
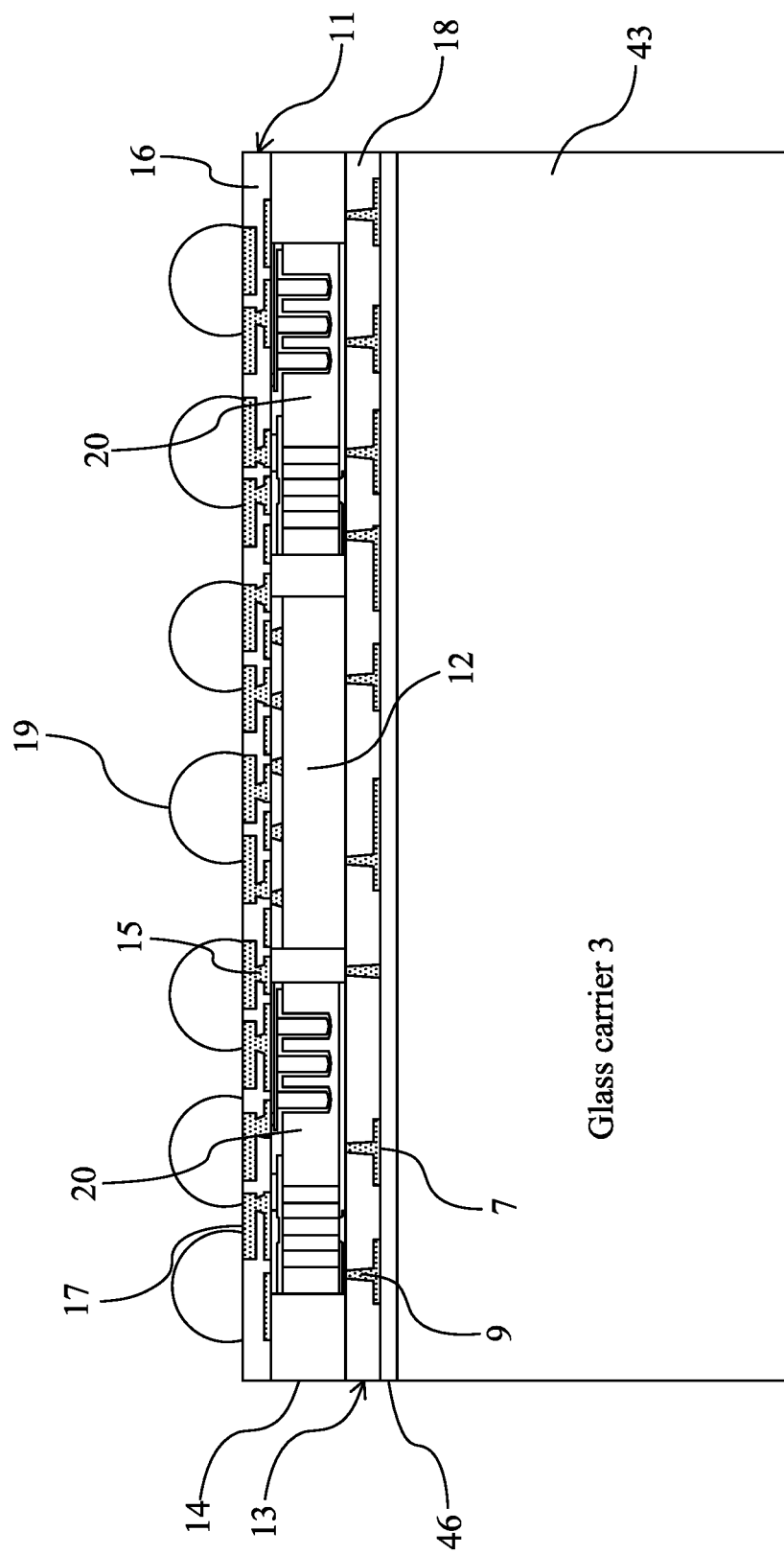

FIG. 4i depicts a third carrier 43 attached to the backside of the wafer. The second carrier 42 is removed in a fashion similar to the first carrier 41. Solder balls 19 may be placed along the top side of the wafer forming a BGA in contact with the first set of external contact pads 17 as shown in FIG. 1*a*.

Figure 4J:
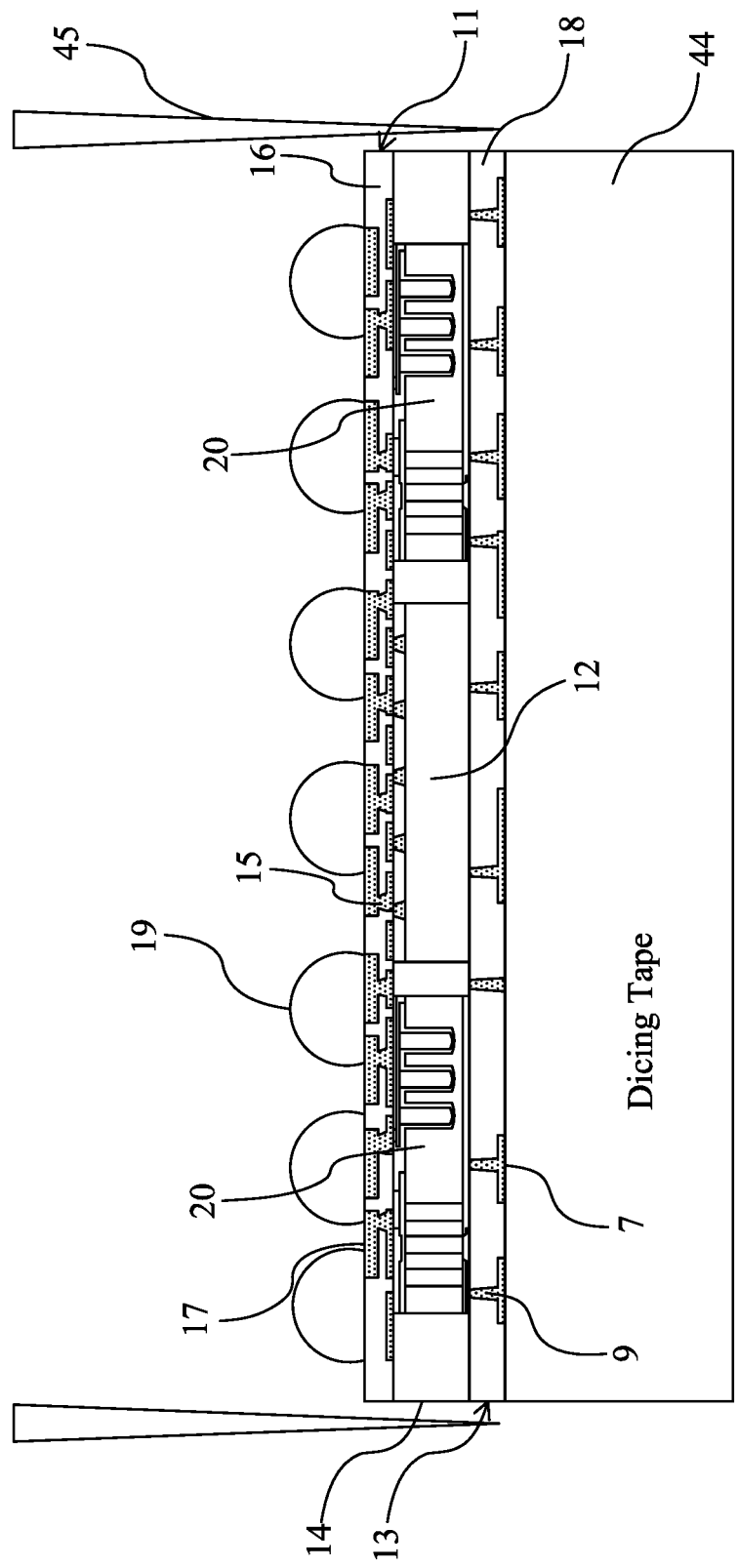

Finally, FIG. 4*j* depicts removal of the third carrier 43 in a fashion similar to the first and second carriers 41/42. Optionally, dicing tape 44 is then adhered to a surface of the second interconnect layer 13. In some embodiments, multiple PoPs may be formed simultaneously. In these embodiments, dicing tape 44 may be applied and a dicing process performed along lines 45 to separate a structure into a plurality of packages, such as that illustrated in FIG. 1*a*. In an embodiment each of the resulting structures include a die 12 and connection blocks 20 encased laterally in molding compound 14. The resulting packages may then be bonded to other packaging components such as package substrates or a PCB through solder balls 19 or through additional solder balls/bumps attached to the opposite side of the die with second set of external contacts 7, such as illustrated in FIG. 3.

In an embodiment, a semiconductor device having a die, a first material, and a second material is provided. The second material and the first material are positioned along a major axis of the die. The first material comprises one or more conductive features extending through the first material.

In another embodiment, a semiconductor device comprising a top package and a bottom package is provided. The bottom package comprises a die and a connection block separated from the die by a molding compound.

In yet another embodiment, a method of forming a semiconductor device is provided. The method comprises providing a die and a connection block having one or more conductive elements. A layer comprising the die and the connection block separated by a material layer, wherein the connection block is formed of a material different from the material layer, is formed.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first planar surface comprising an encapsulant, a first semiconductor device, and a connection block, wherein the first semiconductor device, the encapsulant, and a passive device located within the connection block each have top surfaces which are planar with each other;
   a second planar surface comprising the encapsulant, the first semiconductor device and the connection block;
   a first redistribution layer located adjacent to the first planar surface; and
   a second redistribution layer located adjacent to the second planar surface, wherein the encapsulant, the passive device and the first semiconductor device are each coplanar with each other with respect to respective top and bottom sides as seen in a cross-sectional view.

2. The semiconductor device of claim 1, wherein the second redistribution layer is an interposer.

3. The semiconductor device of claim 1, wherein the second redistribution layer is a packaging substrate.

4. The semiconductor device of claim 1, wherein the second redistribution layer is a silicon interposer.

5. The semiconductor device of claim 1, wherein the second redistribution layer is an organic substrate.

6. The semiconductor device of claim 1, wherein the second redistribution layer is a laminate substrate.

7. The semiconductor device of claim 1, wherein the connection block is one of a plurality of connection blocks, the plurality of connection blocks arranged in a ring around the first semiconductor device.

8. A semiconductor device comprising:
   through vias extending through a first connection block and electrically connecting a first redistribution layer and a second redistribution layer;
   solder balls in physical connection with the second redistribution layer;
   a memory stack bonded to the first redistribution layer;
   a passive device different from the through vias; and
   a semiconductor die planar with an encapsulant, wherein the encapsulant, the passive device and the semiconductor die are each coplanar with each other with respect to respective top and bottom sides as seen in a cross-sectional view.

9. The semiconductor device of claim 8, further comprising a second connection block located on an opposite side of the semiconductor device from the first connection block.

10. The semiconductor device of claim 9, wherein the first connection block and the second connection block are part of a ring of connection blocks that encircle the semiconductor die.

11. The semiconductor device of claim 10, wherein the ring of connection blocks continuously encircles the semiconductor die.

12. The semiconductor device of claim 10, wherein the ring of connection blocks brokenly encircles the semiconductor die.

13. The semiconductor device of claim 8, wherein the first connection block is the only connection block within the encapsulant.

14. The semiconductor device of claim 13, wherein the semiconductor device is the only semiconductor die within the encapsulant.

15. A semiconductor device comprising:
   a multi-chip package;
   a first package bonded to the multi-chip package, the multi-chip package comprising at least two planar surfaces, a first one of the at least two planar surfaces comprising an encapsulant, an integrated passive device, and a first semiconductor device, and wherein a second one of the at least two planar surfaces comprises the encapsulant and the first semiconductor device; and
   a through via extending through a connection block from the first one of the at least two planar surfaces to the second one of the at least two planar surfaces, wherein a top side and a bottom side of the encapsulant are coplanar with respective sides of both the first semiconductor device and the integrated passive device within the connection block.

16. The semiconductor device of claim 15, wherein the integrated passive device is an inductor.

17. The semiconductor device of claim 16, wherein the inductor extends from a first side of the connection block to a second side of the connection block.

18. The semiconductor device of claim 16, wherein the inductor is formed in a metallization layer on a single side of the connection block.

19. The semiconductor device of claim 15, further comprising a first interconnect layer located adjacent to the second one of the at least two planar surfaces.

20. The semiconductor device of claim 19, wherein the first interconnect layer comprises a laminate substrate.

* * * * *